US011508308B2

(12) United States Patent
Shin et al.

(10) Patent No.: US 11,508,308 B2
(45) Date of Patent: Nov. 22, 2022

(54) DISPLAY APPARATUS AND METHOD OF OPERATING THE SAME

(71) Applicant: Samsung Display Co., Ltd., Yongin-Si (KR)

(72) Inventors: Jae Hoon Shin, Incheon (KR); Kyung Man Kim, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/313,043

(22) Filed: May 6, 2021

(65) Prior Publication Data

US 2021/0358418 A1 Nov. 18, 2021

(30) Foreign Application Priority Data

May 15, 2020 (KR) ........................ 10-2020-0058539

(51) Int. Cl.
*G09G 3/3266* (2016.01)
*H01L 27/32* (2006.01)
*G09G 3/3291* (2016.01)

(52) U.S. Cl.
CPC ......... *G09G 3/3266* (2013.01); *G09G 3/3291* (2013.01); *G09G 2300/0426* (2013.01);
(Continued)

(58) Field of Classification Search
CPC .......... G09G 3/30; G09G 3/32; G09G 3/3208; G09G 3/3225; G09G 3/3233; G09G 3/3258; G09G 3/3266; G09G 3/3275; G09G 3/3291; G09G 3/3648; G09G 2300/0426; G09G 2300/043; G09G 2300/0809; G09G 2300/0819; G09G 2300/0842; G09G 2300/0866; G09G 2310/0251; G09G 2310/027; G09G 2310/0272; G09G 2310/0278; G09G 2310/08; G09G 2320/0204; G09G 2320/0223;
(Continued)

(56) References Cited

U.S. PATENT DOCUMENTS

2008/0074362 A1* 3/2008 Ogura .................. G09G 3/3275 345/77
2015/0042697 A1* 2/2015 Park ..................... G09G 3/2092 345/77

(Continued)

FOREIGN PATENT DOCUMENTS

KR 10-1908513 B1 10/2018
WO 2001-053883 A1 7/2001

*Primary Examiner* — Michael J Eurice
(74) *Attorney, Agent, or Firm* — Innovation Counsel LLP

(57) ABSTRACT

A display apparatus includes a display panel, a scan driver, a data driver and a timing controller. The display panel includes a plurality of pixels that are connected to a plurality of data lines and a plurality of scan lines having different lengths. The scan driver apply a plurality of scan signals to the plurality of scan lines. The data driver apply a plurality of data voltages to the plurality of data lines, and receive a plurality of sensing data that represent operating characteristics of all of the plurality of pixels from a plurality of sensing lines. The timing controller controls operations of the scan driver and the data driver, generates output image data considering the operating characteristics of all of the plurality of pixels and supply the output image data to the data drive.

30 Claims, 11 Drawing Sheets

(52) U.S. Cl.
CPC ................. *G09G 2310/027* (2013.01); *G09G 2310/0272* (2013.01); *G09G 2310/0278* (2013.01); *G09G 2310/08* (2013.01)

(58) Field of Classification Search
CPC ... G09G 2320/0285; G09G 2320/0295; G09G 2320/043; G09G 2320/045; G09G 2320/0693; H01L 27/32; H01L 27/3244
See application file for complete search history.

(56) References Cited

U.S. PATENT DOCUMENTS

| | | | | |
|---|---|---|---|---|
| 2017/0358258 | A1* | 12/2017 | Kim | G09G 3/3225 |
| 2019/0035331 | A1 | 1/2019 | Do et al. | |
| 2019/0096335 | A1 | 3/2019 | Kim et al. | |
| 2020/0051499 | A1* | 2/2020 | Chung | G09G 3/3266 |
| 2021/0318773 | A1* | 10/2021 | Kim | G06F 3/04166 |

* cited by examiner

FIG. 5

| | |
|---|---|
| VD3 | V1 |
| VD2, VD4 | V1+a |
| VD1, VD5 | V1+b |
| ⋮ | ⋮ |
| VD6 | V1+k |

DISPLAY APPARATUS AND METHOD OF OPERATING THE SAME

CROSS-REFERENCE TO RELATED APPLICATION

This application claims priority under 35 USC § 119 to Korean Patent Application No. 10-2020-0058539, filed on May 15, 2020 in the Korean Intellectual Property Office (KIPO), the contents of which are herein incorporated by reference in their entirety.

BACKGROUND

1. Technical Field

Example embodiments relate generally to displaying images, and more particularly to display apparatuses and methods of operating the display apparatuses.

2. Description of the Related Art

A flat panel display (FPD), which is easy to implement a big screen and is thin and lightweight, is widely used as a display apparatus in recent years. The FPD may include, but are not limited to, a liquid crystal display (LCD), a plasma display panel (PDP) and an organic light emitting display (OLED), for example. Such display apparatus includes a display panel in which a plurality of pixels are arranged in a matrix form, a data driver that supplies data signals, a scan driver that supplies scan signals, and the like.

Typically, the display apparatus may have a structure in which the scan driver is arranged on one side of the display panel and the data driver is arranged on another side of the display panel. However, the display apparatus utilized in a mobile device in recent years requires a narrow bezel having a minimized non-display region. In order to embody the narrow bezel, a single-side driving (SSD) in which both the scan driver and the data driver are arranged on one side of the display panel has been researched.

SUMMARY

At least one example embodiment of the present disclosure provides a display apparatus capable of having improved or enhanced display quality while operating in a single-side driving scheme.

At least one example embodiment of the present disclosure provides a method of operating the display apparatus.

According to example embodiments, a display apparatus includes a display panel, a scan driver, a data driver and a timing controller. The display panel includes a plurality of pixels that are connected to a plurality of data lines and a plurality of scan lines having different lengths. The scan driver applies a plurality of scan signals to the plurality of scan lines. The data driver applies a plurality of data voltages to the plurality of data lines, and receives a plurality of sensing data that represent operating characteristics of all of the plurality of pixels from a plurality of sensing lines. The timing controller controls operations of the scan driver and the data driver, generates output image data considering the operating characteristics of all of the plurality of pixels and supply the output image data to the data driver.

In an example embodiment, the plurality of scan lines may include a plurality of main scan lines and a plurality of sub scan lines. The plurality of main scan lines may extend in a first direction and may be connected to the plurality of pixels. The plurality of sub scan lines may extend in a second direction crossing the first direction and may connect the scan driver with the plurality of main scan lines.

In an example embodiment, lengths of the plurality of main scan lines may be equal to each other, and lengths of the plurality of sub scan lines may be different from each other.

In an example embodiment, the plurality of data lines may extend in the second direction and may be connected to the plurality of pixels. The plurality of sub scan lines and the plurality of data lines may be alternately arranged along the first direction.

In an example embodiment, the scan driver and the data driver may be arranged together on one side of the display panel.

In an example embodiment, a first main scan line among the plurality of main scan lines and a first sub scan line among the plurality of sub scan lines may form a first scan line among the plurality of scan lines. Pixels arranged in a first pixel row among the plurality of pixels may be connected to the first scan line. When the pixels arranged in the first pixel row display a same gray scale, the plurality of data voltages having different levels may be applied to the plurality of data lines by adjusting the levels of the plurality of data voltages depending on positions of the pixels arranged in the first pixel row.

In an example embodiment, when a first pixel disposed closest to a first connection point at which the first main scan line and the first sub scan line are connected to each other, a first data voltage having a first level may be applied to a first data line connected to the first pixel. When a second pixel spaced apart from the first connection point by a first distance, a second data voltage having a second level different from the first level may be applied to a second data line connected to the second pixel.

In an example embodiment, the second level may be higher than the first level.

In an example embodiment, the second level may increase as the first distance increases.

In an example embodiment, when a third pixel spaced apart from the first connection point by a second distance, a third data voltage having a third level different from the first level may be applied to a third data line connected to the third pixel. When first distance and the second distance are equal to each other, the second level and the third level are equal to each other.

In an example embodiment, the data driver may include a plurality of sensing circuits. The plurality of sensing circuits may be connected to the plurality of pixels through the plurality of sensing lines that are insulated from the plurality of data lines, and may obtain the plurality of sensing data through the plurality of sensing lines.

In an example embodiment, a first pixel among the plurality of pixels may include a first transistor, a second transistor, an organic light emitting diode, a storage capacitor and a third transistor. The first transistor may be connected between a first power supply voltage and a first node, and may include a gate electrode. The second transistor may include a first electrode connected to a first data line, a gate electrode connected to a first scan line, and a second electrode connected to the gate electrode of the first transistor. The organic light emitting diode may be connected between the first node and a second power supply voltage. The storage capacitor may be connected between the gate electrode of the first transistor and the first node. The third transistor may be connected between the first node and a first sensing line, and may include a gate electrode.

In an example embodiment, a first sensing circuit among the plurality of sensing circuits may include a first switch, a second switch and an analog-to-digital converter. The first switch may selectively provide an initialization voltage to the first sensing line. The second switch may obtain a first sensing value from the first sensing line. The analog-to-digital converter may convert the first sensing value into first sensing data for the first pixel.

In an example embodiment, the operating characteristic of the first pixel may be extracted by detecting the first sensing data multiple times and by averaging the detected first sensing data.

In an example embodiment, the operating characteristic of the first pixel may include a threshold voltage of the first transistor.

In an example embodiment, the timing controller may include a look-up table, a calculator and an image processor. The look-up table may store the operating characteristics of all of the plurality of pixels. The calculator may extract the operating characteristics of all of the plurality of pixels based on the plurality of sensing data, and may store the extracted operating characteristics to the look-up table. The image processor may generate the output image data based on the data stored in the look-up table and input image data.

In an example embodiment, the timing controller may include a look-up table and an image processor. The look-up table may store the operating characteristics of all of the plurality of pixels. The image processor may generate the output image data based on the data stored in the look-up table and input image data. An external calculator may extract the operating characteristics of all of the plurality of pixels based on the plurality of sensing data, and may store the extracted data to the look-up table.

According to example embodiments, in a method of operating a display apparatus including a display panel, a plurality of sensing data that represent operating characteristics of all of a plurality of pixels included in the display panel are obtained. The plurality of pixels are connected to a plurality of data lines and a plurality of scan lines having different lengths. The operating characteristics of all of the plurality of pixels extracted based on the plurality of sensing data are stored. Output image data is generated based on input image data and the operating characteristics of all of the plurality of pixels. An image is displayed on the display panel by generating a plurality of data voltages based on the output image data to apply the plurality of data voltages to the plurality of data lines, and by generating a plurality of scan signals to apply the plurality of scan signals to the plurality of scan lines.

In an example embodiment, when pixels arranged in a same pixel row among the plurality of pixels display a same grayscale, the image may be displayed on the display panel by adjusting levels of the plurality of data voltages depending on positions of the pixels arranged in the same pixel row and by applying the plurality of data voltages having different levels to the plurality of data lines.

In an example embodiment, the plurality of sensing data may be obtained by applying an initialization voltage to a plurality of sensing lines that are formed separately from the plurality of data lines and connected to the plurality of pixels, by obtaining a plurality of sensing values through the plurality of sensing lines, and by converting the plurality of sensing values into digital data.

According to example embodiments, a display apparatus includes a display panel, a scan driver and a data driver. The display panel includes a plurality of pixels that are connected to a plurality of data lines, a plurality of sensing lines and a plurality of scan lines having different lengths. Each of the plurality of pixels includes an organic light emitting diode and a first transistor for driving the organic light emitting diode. The scan driver drives the plurality of scan lines. The data driver drives the plurality of data lines based on a plurality of sensing data that represent operating characteristics of all of the plurality of pixels, and includes a plurality of sensing circuits that obtain the plurality of sensing data through the plurality of sensing lines. Each of the plurality of sensing circuits includes a first switch and an analog-to-digital converter. The first switch provides an initialization voltage to one of the plurality of sensing lines. The analog-to-digital converter performs an analog-to-digital conversion on a sensing value obtained from the one of the plurality of sensing lines.

In an example embodiment, the scan driver and the data driver may be arranged together on one side of the display panel.

In an example embodiment, the lengths of plurality of scan lines may become longer as a distance from the scan driver increases.

In an example embodiment, the plurality of scan lines may include a plurality of main scan lines and a plurality of sub scan lines. The plurality of main scan lines may extend in a first direction and may be connected to the plurality of pixels. The plurality of sub scan lines may extend in a second direction crossing the first direction and may connect the scan driver with the plurality of main scan lines.

In an example embodiment, lengths of the plurality of main scan lines may be equal to each other, and lengths of the plurality of sub scan lines may be different from each other.

In an example embodiment, the first transistor may be connected between a first power supply voltage and a first node. The organic light emitting diode may be connected between the first node and a second power supply voltage. Each of the plurality of sensing circuits may further include a second transistor, a storage capacitor and a third transistor. The second transistor may be connected between one of the plurality of data lines and a gate electrode of the first transistor. The storage capacitor may be connected between the gate electrode of the first transistor and the first node. The third transistor may be connected between the first node and one of the plurality of sensing lines.

In an example embodiment, each of the plurality of sensing circuits may further include a second switch connecting the analog-to-digital converter to the one of the plurality of sensing lines.

In an example embodiment, the operating characteristics of all of the plurality of pixels extracted based on the plurality of sensing data may include a threshold voltage of the first transistor.

In an example embodiment, the display apparatus may further include a timing controller. The timing controller may control operations of the scan driver and the data driver, and store the operating characteristics of all of the plurality of pixels in a look-up table.

In an example embodiment, when pixels arranged in a same pixel row among the plurality of pixels display a same grayscale, the image may be displayed on the display panel by adjusting levels of a plurality of data voltages depending on positions of the pixels arranged in the same pixel row and by applying the plurality of data voltages having different levels to the plurality of data lines.

According to example embodiments, a display device includes a plurality of pixels disposed in a display area through which an image is displayed, the plurality of pixels being connected to a plurality of scan lines each of which having different lengths and including a main scan line extending along a first direction and a sub scan line extending along a second direction substantially perpendicular to the first direction, a plurality of data lines extending along the second direction and a plurality of sensing lines extending along the second direction, a scan driver connected to the plurality of scan lines and a data driver connected to the plurality of data lines. The main scan line and the sub scan line may be connected to each other in the display area.

In an example embodiment, the display device may further include an interlayer insulating layer disposed between the main scan line and the sub scan line. The main scan line and the sub scan line may be connected to each other through a contact hole formed in the interlayer insulating layer.

In an example embodiment, the main scan line may be formed of a conductive layer forming the plurality of scan lines and the sub scan line may be formed of a conductive layer forming the plurality of data lines.

In an example embodiment, a plurality of sub scan lines of the plurality of scan lines may include a first portion in which at least two of the plurality of sub scan lines are disposed adjacent to each other and a second portion in which one sub scan line is disposed between adjacent data lines.

In the display apparatus and the method of operating the display apparatus according to example embodiments, the display apparatus may be implemented with the single-side driving scheme in which both the scan driver and the data driver are arranged on one side of the display panel together and the plurality of scan lines have different lengths. In addition, the display apparatus may include the look-up table that stores the operating characteristics of all of the plurality of pixels to perform the data compensating operation to compensate for the coupling phenomenon caused by the plurality of sub scan lines. Further, the display apparatus may include a configuration for obtaining/storing the look-up table and a configuration for performing the data compensating operation using the look-up table. Accordingly, the deterioration of display quality due to the coupling phenomenon caused by the plurality of sub scan lines may be prevented, and the display quality may be improved.

BRIEF DESCRIPTION OF THE DRAWINGS

Illustrative, non-limiting example embodiments will be more clearly understood from the following detailed description taken in conjunction with the accompanying drawings.

FIGS. 4 and 5 are diagrams for describing an operation of displaying an image using a look-up table in a display apparatus according to example embodiments.

DETAILED DESCRIPTION OF THE EMBODIMENTS

Figure 1:
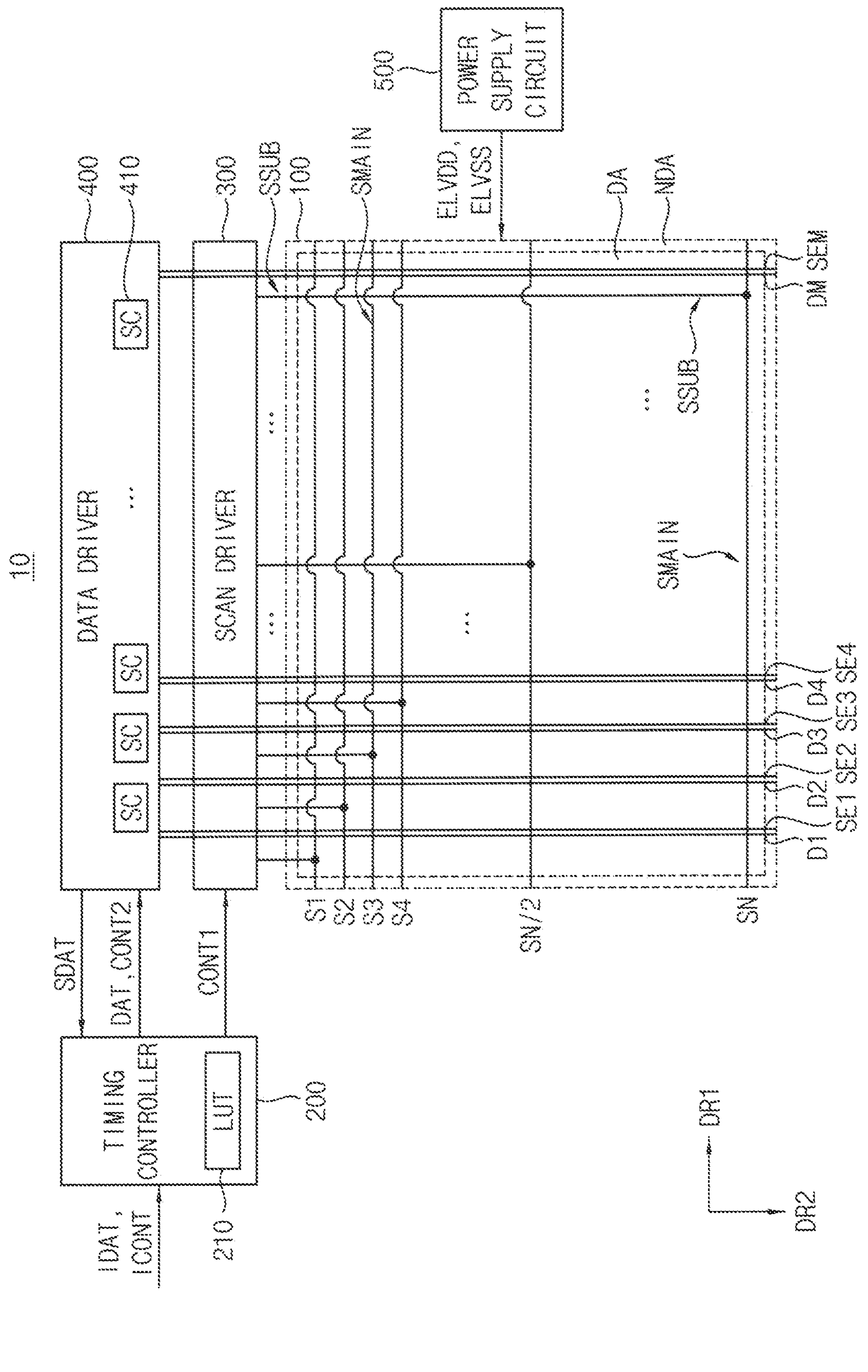
FIG. 1 is a block diagram illustrating a display apparatus according to example embodiments.

Various exemplary embodiments will be described more fully with reference to the accompanying drawings, in which embodiments are shown. This inventive concept may, however, be embodied in many different forms and should not be construed as limited to the embodiments set forth herein. Like reference numerals refer to like elements throughout this application.

FIG. 1 is a block diagram illustrating a display apparatus according to example embodiments.

Referring to FIG. 1, a display apparatus 10 includes a display panel 100, a timing controller 200, a scan driver 300 and a data driver 400. The display apparatus 10 may further include a power supply circuit 500.

The display panel may include a display area DA displaying an image and non-display area NDA surrounding the display are DA and not displaying an image. The display panel 100 operates (e.g., display an image) based on output image data DAT. The display panel 100 is connected to the scan driver 300 through a plurality of scan lines S1, S2, S3, S4, . . . , SN/2, . . . , SN, where N is a natural number greater than or equal to two. The display panel 100 is connected to the data driver 400 through a plurality of data lines D1, D2, D3, D4, . . . , DM, where M is a natural number greater than or equal to two. The display panel 100 includes a plurality of pixels (e.g., a pixel PX of FIG. 2) that are arranged in a matrix formation. Each of the plurality of pixels may be electrically connected to a respective one of the plurality of scan lines S1, S2, S3, S4, . . . , SN/2, . . . , SN and a respective one of the plurality of data lines D1, D2, D3, D4, . . . , DM. Although not illustrated in detail, the display panel 100 may include a display region including the plurality of pixels and a peripheral region surrounding the display region.

The display apparatus 10 according to example embodiments is implemented with a single-side driving (SSD) scheme in which both the scan driver 300 and the data driver 400 are arranged or disposed on one side of the display panel 100, and thus the plurality of scan lines S1, S2, S3, S4, . . . , SN/2, . . . , SN have different lengths.

For example, the plurality of scan lines S1, S2, S3, S4, . . . , SN/2, . . . , SN may include a plurality of main scan lines SMAIN and a plurality of sub scan lines SSUB. The plurality of main scan lines SMAIN may extend in a first direction DR1, and may be connected to the plurality of pixels PX disposed in one row. The plurality of sub scan lines SSUB may extend in a second direction DR2 crossing (e.g., substantially perpendicular to) the first direction DR1, and may connect the scan driver 300 to the plurality of main scan lines SMAIN.

Lengths of the plurality of main scan lines SMAIN may be substantially equal to each other. Lengths of the plurality of sub scan lines SSUB may be different from each other because distances between the plurality of main scan lines SMAIN and the scan driver 300 are different from each other. For example, as illustrated in FIG. 1, the plurality of sub scan lines SSUB may be formed to gradually decrease in length as they go to the left, and thus a plurality of connection points at which the plurality of main scan lines SMAIN and the plurality of sub scan lines SSUB are connected to each other may be arranged in a diagonal direction from the upper left to the lower right. However, example embodiments are not limited thereto, and the wiring structure of the plurality of scan lines S1, S2, S3, S4, . . . , SN/2, . . . , SN may be implemented in various schemes. For another example, although not illustrated in FIG. 1, the plurality of sub scan lines SSUB may be formed to gradually decrease in length as they go to the right.

The plurality of data lines D1, D2, D3, D4, . . . , DM may extend in the second direction DR2 and each of the plurality of data lines D1, D2, D3, D4, . . . , DM may be connected to the plurality of pixels PX in one column. The plurality of sub scan lines SSUB and the plurality of data lines D1, D2, D3, D4, . . . , DM may be alternately arranged along the first direction DR1. Each of the plurality of sub scan lines SSUB may be disposed approximately every two data lines of the plurality of data lines D1, D2, D3, D4, . . . , DM. Lengths of the plurality of data lines D1, D2, D3, D4, . . . , DM may be substantially equal to each other.

In some example embodiments, the display panel 100 may be a self-emitting display panel that emits light without the use of a backlight unit. For example, the display panel 100 may be an organic light emitting display panel. As will be described with reference to FIG. 2, each of the plurality of pixels PX may be a pixel for the organic light emitting display panel including an organic light emitting diode (OLED) operating as a light emitting element and a driving transistor for driving the OLED. For another example, the display panel 100 may be a micro light emitting diode (LED) display panel, an inorganic light emitting display panel or a quantum dot light emitting display (QLED) panel. However, example embodiments are not limited thereto, and the display panel 100 and the plurality of pixels PX may be implemented in various manners.

In some example embodiments, the plurality of pixels PX may include a plurality of red pixels outputting red light, a plurality of green pixels outputting green light and a plurality of blue pixels outputting blue light. In other example embodiments, the plurality of pixels PX may include a plurality of yellow pixels outputting yellow light, a plurality of cyan pixels outputting cyan light and a plurality of magenta pixels outputting magenta light. In still other example embodiments, the plurality of pixels PX may further include a plurality of white pixels outputting white light, or may include pixels outputting light of other colors.

The timing controller 200 controls operations of the display panel 100, the source driver 300 and the data driver 400. The timing controller 200 receives input image data IDAT and an input control signal ICONT from an external device (e.g., a host device or a graphic processor). For example, the input image data IDAT may include a plurality of pixel data for the plurality of pixels PX. For example, the input control signal ICONT may include a master clock signal, a data enable signal, a vertical synchronization signal, a horizontal synchronization signal, etc.

The timing controller 200 generates the output image data DAT based on the input image data IDAT. For example, the timing controller 200 may selectively perform an image quality compensation, a spot compensation, an adaptive color correction (ACC) and/or a dynamic capacitance compensation (DCC) on the input image data IDAT to generate the output image data DAT.

The timing controller 200 generates a first control signal CONT1 for controlling the scan driver 300 and a second control signal CONT2 for controlling the data driver 400 based on the input control signal ICONT. For example, the first control signal CONT1 may include a vertical start signal, a scan clock signal, etc. For example, the second control signal CONT2 may include a horizontal start signal, a data clock signal, etc.

The scan driver 300 is connected to the display panel 100 through the plurality of scan lines S1, S2, S3, S4, . . . , SN/2, . . . , SN, and generates a plurality of scan signals applied to the plurality of scan lines S1, S2, S3, S4, . . . , SN/2, . . . , SN in response to the first control signal CONT1. The scan driver 300 may sequentially apply or provide the plurality of scan signals to the plurality of scan lines S1, S2, S3, S4, . . . , SN/2, . . . , SN. The plurality of scan lines S1, S2, S3, S4, . . . , SN/2, . . . , SN may be sequentially enabled or activated in response to the plurality of scan signals.

The data driver 400 is connected to the display panel 100 through the plurality of data lines D1, D2, D3, D4, . . . , DM, and generates a plurality of data voltages (e.g., analog voltages) applied to the plurality of data lines D1, D2, D3, D4, . . . , DM in response to the second control signal CONT2 and the output image data DAT (e.g., digital data). Although not illustrated in detail, the data driver 400 may include a digital-to-analog converter (DAC) that converts the output image data DAT in a digital form into the plurality of data voltages in an analog form. The data driver 400 may sequentially apply or provide the plurality of data voltages to the display panel 100 one row at a time.

The power supply circuit 500 may supply a first power supply voltage ELVDD and a second power supply voltage ELVSS to the display panel 100. For example, the first power supply voltage ELVDD may be a high power supply voltage, and the second power supply voltage ELVSS may be a low power supply voltage.

In some example embodiments, the scan driver 300 and/or the data driver 400 may be disposed, e.g., directly mounted, on the display panel 100, or may be connected to the display panel 100 in a tape carrier package (TCP) type. Alternatively, the scan driver 300 and/or the data driver 400 may be directly integrated on the display panel 100.

In some example embodiments, the timing controller 200 may be mounted on a printed circuit board (PCB), and the scan driver 300 and/or the data driver 400 may be mounted on a flexible PCB (FPCB). For example, the FPCB may electrically connect the PCB with the display panel 100. For example, the PCB and the FPCB may be electrically connected by an anisotropic conductive film (ACF), and the FPCB and the display panel 100 may be electrically connected by an ACF.

In some example embodiments, the timing controller 200, the scan driver 300, the data driver 400 and the power supply circuit 500 may be respectively implemented with separate circuits/modules/chips. In other example embodiments, the timing controller 200, the scan driver 300, the data driver 400 and the power supply circuit 500 may be combined into one circuit/module/chip, or may be further separated into a plurality of circuits/modules/chips.

The display apparatus 10 according to example embodiments is implemented with the single-side driving scheme, and is implemented to compensate for deterioration or degradation in display quality due to a coupling phenomenon caused by the plurality of sub scan lines SSUB.

For example, the data driver 400 obtains or acquires a plurality of sensing data SDAT that represent operating characteristics of each of the plurality of pixels PX. To obtain the plurality of sensing data SDAT, the data driver 400 may include a plurality of sensing circuits (SC) 410. The plurality of sensing circuits 410 may be connected to the plurality of pixels PX through a plurality of sensing lines SE1, SE2, SE3, SE4, . . . , SEM, and may obtain the plurality of sensing data SDAT through the plurality of sensing lines SE1, SE2, SE3, SE4, . . . , SEM. The plurality of sensing circuits 410 may be referred to as an external compensation intellectual property (IP). A detailed configuration of each of the plurality of sensing circuits 410 will be described with reference to FIG. 6.

The plurality of sensing lines SE1, SE2, SE3, SE4, . . . , SEM may be formed separately from the plurality of data lines D1, D2, D3, D4, . . . , DM and may extend in the second direction DR2. Each of the plurality of sensing lines SE1, SE2, SE3, SE4, . . . , SEM may be connected to the plurality of pixels PX disposed in one column. The number of the plurality of sensing lines SE1, SE2, SE3, SE4, . . . , SEM may be substantially equal to the number of the plurality of data lines D1, D2, D3, D4, . . . , DM. The plurality of sub scan lines SSUB, the plurality of data lines D1, D2, D3, D4, . . . , DM, and the plurality of sensing lines SE1, SE2, SE3, SE4, . . . , SEM may be alternately arranged along the first direction DR1.

In some example embodiments, the number of the plurality of sensing circuits 410 may be substantially equal to the number of the plurality of data lines D1, D2, D3, D4, . . . , DM and the number of the plurality of sensing lines SE1, SE2, SE3., SE4, . . . , SEM, and pixels arranged in one pixel row may be connected to different sensing circuits. In other example embodiments, the number of the plurality of sensing circuits 410 may be less than the number of the plurality of data lines D1, D2, D3, D4, . . . , DM and the number of the plurality of sensing lines SE1, SE2, SE3. , SE4, . . . , SEM, and pixels adjacent to each other and arranged in one pixel row may share one sensing circuit.

The timing controller 200 includes a look-up table (LUT) 210 that stores the operating characteristics of all of the plurality of pixels PX extracted based on the plurality of sensing data SDAT, and generates the output image data DAT used for generating the plurality of data voltages using data stored in the look-up table 210. In other words, the timing controller 200 may perform a data compensating operation to compensate for the coupling phenomenon caused by the plurality of sub scan lines SSUB using the data stored in the look-up table 210.

In some example embodiments, the operating characteristics of the plurality of pixels PX may include a threshold voltage of the driving transistor included in each of the plurality of pixels PX. However, example embodiments are not limited thereto, and the operating characteristics of the plurality of pixels PX may further include a mobility and/or EL characteristic of the light emitting element (e.g., the OLED) included in each of the plurality of pixels PX.

In some example embodiments, an operation of obtaining and storing the data in the look-up table 210 and an operation of generating the output image data DAT may be performed in different operation modes. For example, the operation of obtaining and storing the data in the look-up table 210 may be performed in a first operation mode, and the operation of generating the output image data DAT may be performed in a second operation mode different from the first operation mode. The first operation mode may be referred to as a sensing mode, and the second operation mode may be referred to as a display mode or a normal mode. For example, the first operation mode may be an operation mode in a manufacturing process of the display apparatus 10, and the second operation mode may be an operation mode in a process of actually displaying an image after the display apparatus 10 is manufactured.

In an example of FIG. 1, the plurality of sensing data SDAT may be directly provided to the timing controller 200. In this example, the timing controller 200 may extract the operating characteristics of all of the plurality of pixels PX by itself based on the plurality of sensing data SDAT, and may obtain and store the data in the look-up table 210. A detailed configuration and operation of the timing controller 200 will be described with reference to FIGS. 3, 4 and 5.

Figure 2:
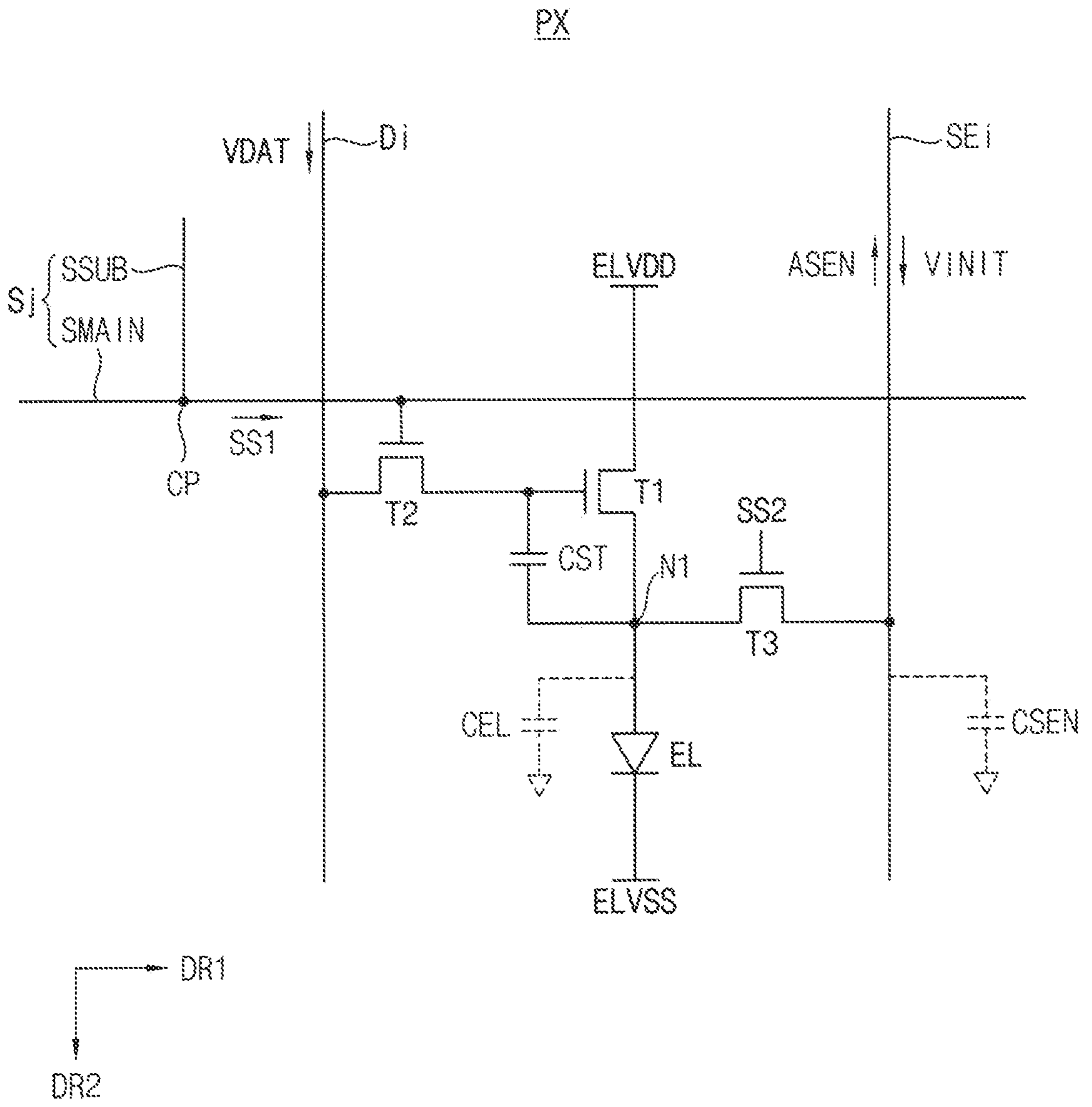
FIG. 2 is a circuit diagram illustrating an example of a pixel included in a display panel of a display apparatus according to example embodiments.

FIG. 2 is a circuit diagram illustrating an example of a pixel included in a display panel of a display apparatus according to example embodiments.

Referring to FIG. 2, each pixel PX may be connected to a scan line Sj, a data line D1 and a sensing line SEi, where j is a natural number less than or equal to N, and i is a natural number less than or equal to M. Each pixel PX may include a first transistor T1, a second transistor T2, a third transistor T3, a storage capacitor CST and an organic light emitting diode EL. As described with reference to FIG. 1, the scan line Sj may include the main scan line SMAIN and the sub scan line SSUB, and the main scan line SMAIN and the sub scan line SSUB may be connected to each other at a connection point CP disposed in the display area DA. The main scan line SMAIN and the sub scan line SSUB may be disposed on different layers and are connected to each other through a contact hole formed through an interlayer insulating layer interposed between the main scan line SMAIN and the sub scan line SSUB. For example, the main scan line may be formed of a conductive layer forming the scan line Sj and the sub scan line may be formed of a conductive layer forming the data line Dj. The sub scan lines may include a first portion in which at least two of the sub scan lines are disposed adjacent to each other and a second portion in which one sub scan line is disposed between adjacent data lines.

The second transistor T2 may include a first electrode connected to the data line D1, a gate electrode connected to the scan line Sj, and a second electrode connected to a gate electrode of the first transistor T1 and the storage capacitor CST. The second transistor T2 may transmit a data voltage VDAT received from the data driver 400 to the storage capacitor CST in response to a scan signal SS1 received from the scan driver 300. The second transistor T2 may be referred to as a switching transistor.

The storage capacitor CST may be connected between the gate electrode of the first transistor T1 and a first node N1. In other words, the storage capacitor CST may include a first electrode connected to the gate electrode of the first transistor T1, and a second electrode connected to the first node N1 and the organic light emitting diode EL. The storage capacitor CST may store the data voltage VDAT transmitted through the second transistor T2.

The first transistor T1 may be connected between the first power supply voltage ELVDD and the first node N1, and may include a gate electrode. In other words, the first transistor T1 may include a first electrode connected to the first power supply voltage ELVDD, a gate electrode connected to the second transistor T2 and the storage capacitor CST, and a second electrode connected to the first node N1 and the organic light emitting diode EL. The first transistor T1 may be turned on or off according to the data voltage VDAT stored in the storage capacitor CST. The first transistor T1 may be referred to as a driving transistor.

The organic light emitting diode EL may be connected between the first node N1 and the second power supply voltage ELVSS. In other words, the organic light emitting diode EL may include an anode electrode connected to the first node N1 and the first transistor T1, and a cathode electrode connected to the second power supply voltage ELVSS. The organic light emitting diode EL may emit light based on a current flowing from the first power supply voltage ELVDD to the second power supply voltage ELVSS while the first transistor T1 is turned on. The brightness or luminance of the pixel PX may increase as the current flowing through the organic light emitting diode EL increases.

The third transistor T3 may be connected between the first node N1 and the sensing line SEi, and may include a gate electrode. In other words, the third transistor T3 may include a first electrode connected to the first transistor T1 and the first node N1, a gate electrode receiving a signal SS2, and a second electrode connected to the sensing line SEi. The third transistor T3 may transmit an initialization voltage VINIT to the second electrode of the first transistor T1 in response to the signal SS2 or may output an analog sensing value ASEN sensed from the second electrode of the first transistor T1 in response to the signal SS2. The third transistor T3 may be referred to as a sensing transistor.

In some example embodiments, the gate electrode of the third transistor T3 may be connected to the scan line Sj, and the signal SS2 may be substantially the same as the scan signal SS1. In other example embodiments, the gate electrode of the third transistor T3 may be connected to the scan driver 300 through a line formed separately from the scan line Sj.

Each pixel PX may further include an organic light emitting capacitor CEL and a sensing capacitor CSEN. Unlike the storage capacitor CST, the sensing capacitor CSEN may be a parasitic capacitor formed between the sensing line SEi and a ground voltage, and the organic light emitting capacitor CEL may be a parasitic capacitor formed between the organic light emitting diode EL and the ground voltage. Thus, the organic light emitting capacitor CEL and the sensing capacitor CSEN are illustrated by dotted lines. As will be described with reference to FIG. 7, the second electrode of the first transistor T1 may be charged by the sensing capacitor CSEN and the initialization voltage VINIT in the sensing mode.

In some example embodiments, the pixel PX may operate in various driving schemes. For example, the driving schemes may include an analog driving scheme and a digital driving scheme. While the analog driving scheme produces grayscale using variable voltage levels corresponding to input data, the digital driving scheme produces grayscale using variable time duration in which the organic light emitting diode EL emits light. The analog driving scheme may be difficult to implement because it requires a driving integrated circuit (IC) that is complicated to manufacture if the display is large and has high resolution. The digital driving scheme, on the other hand, may readily accomplish the required high resolution through a simpler IC structure.

Although FIG. 2 illustrates an OLED pixel as an example of each pixel PX that may be included in the display panel 100, it would be understood that example embodiments are not limited to the OLED pixel and example embodiment may be applied to any pixels of various types and configurations.

Figure 3:
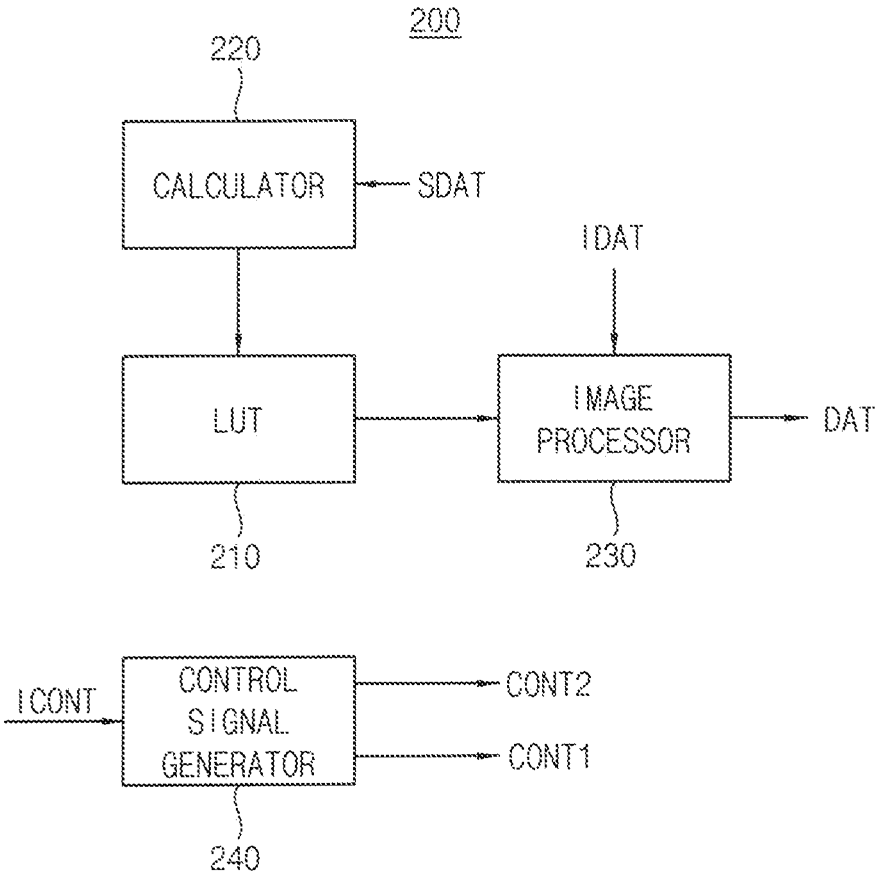
FIG. 3 is a block diagram illustrating an example of a timing controller included in a display apparatus according to example embodiments.

FIG. 3 is a block diagram illustrating an example of a timing controller included in a display apparatus according to example embodiments.

Referring to FIG. 3, the timing controller 200 may include the look-up table 210, a calculator 220 and an image processor 230. The timing controller 200 may further include a control signal generator 240.

The look-up table 210 may store the operating characteristics of all of the plurality of pixels PX. The look-up table 210 may be stored in a buffer, a register and/or a memory. For example, the memory may include at least one of various nonvolatile memories such as an electrically erasable programmable read only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like, and/or at least one of various volatile memories such as a dynamic random access memory (DRAM), a static random access memory (SRAM), or the like.

The calculator 220 may extract the operating characteristics of all of the plurality of pixels PX based on the plurality of sensing data SDAT, and may store the extracted operating characteristics to the look-up table 210. For example, the calculator 220 may perform various modeling, algorithms, etc. based on the plurality of sensing data SDAT to extract the threshold voltage of the driving transistor, the mobility of the light emitting device, the EL characteristic, etc.

The image processor 230 may generate the output image data DAT based on the input image data IDAT and the data stored in the look-up table 210. The output image data DAT may be provided to the display panel 100 through the data driver 400, and the display panel 100 may display an image in which the coupling phenomenon caused by the plurality of sub scan lines SSUB is compensated.

In some example embodiments, the image processor 230 may selectively perform the image quality compensation, the spot compensation, the ACC and/or the DCC on the input image data IDAT.

The control signal generator 240 may generate the first control signal CONT1 and the second control signal CONT2 in response to the input control signal ICONT.

Figure 4:
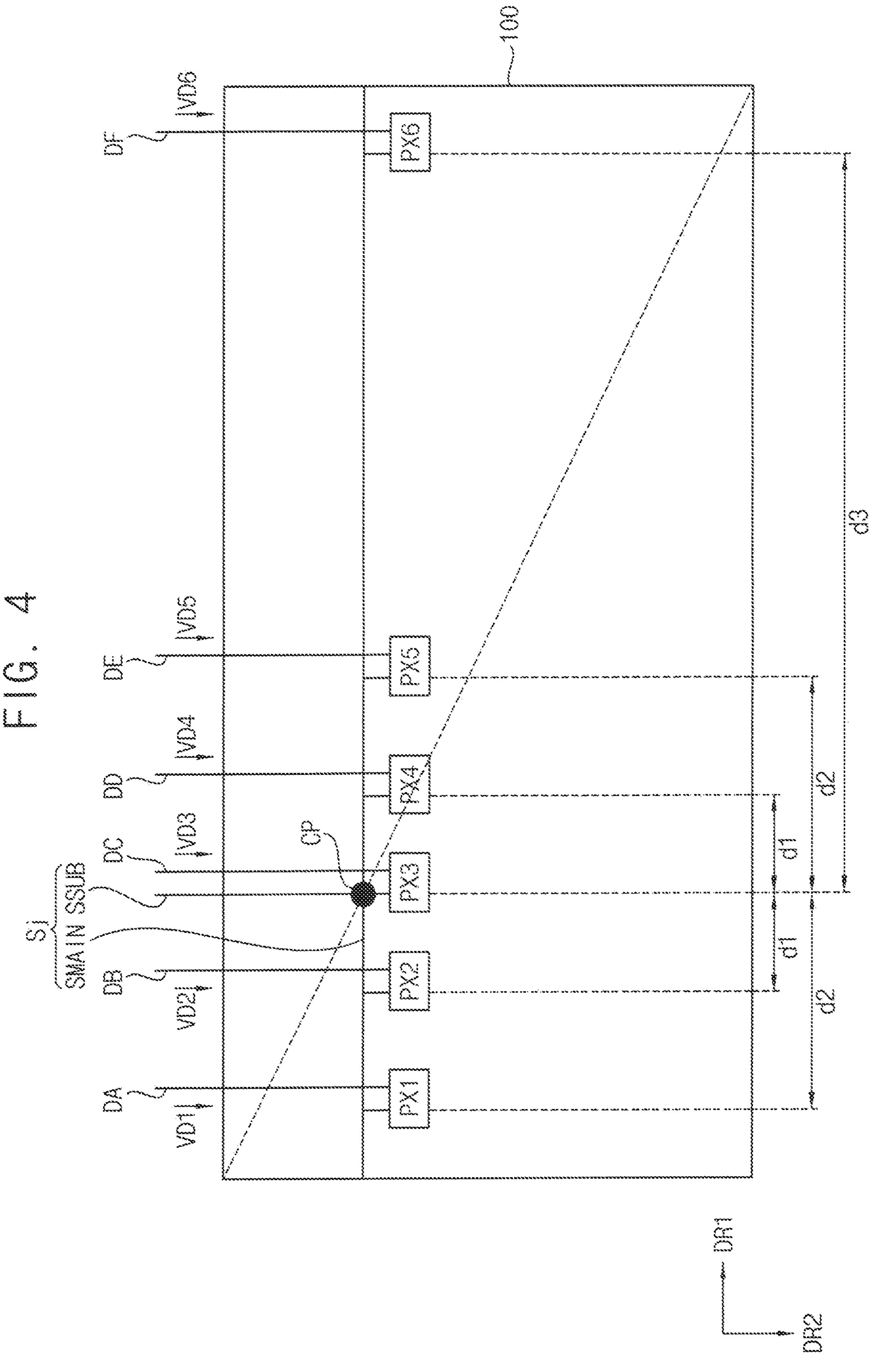

FIGS. 4 and 5 are diagrams for describing an operation of displaying an image using the data stored in a look-up table in a display apparatus according to example embodiments.

Referring to FIGS. 4 and 5, an operation of applying data voltages to the display panel 100 using the output image data DAT that is generated based on the data stored in the look-up table 210 (e.g., that is generated by performing the data compensating operation according to example embodiments) is illustrated. The output image data DAT may be generated in the second operation mode (e.g., in the display mode). For convenience of illustration, only an operation of one pixel row connected to one scan line Sj is illustrated.

The scan line Sj may include the main scan line SMAIN and the sub scan line SSUB. The main scan line SMAIN and the sub scan line SSUB may be connected to each other at the connection point CP. Pixels PX1, PX2, PX3, PX4, PX5 and PX6 may be arranged in the same pixel row, may be connected to the same scan line Sj, and may be connected to different data lines DA, DB, DC, DD, DE and DF, respectively. A dotted line extending diagonally in the display panel 100 may be a virtual line that represents an arrangement of all connection points included in the plurality of scan lines S1, S2, S3, S4, . . . , SN/2, . . . , SN.

In the display apparatus 10 according to example embodiments, when the pixels PX1, PX2, PX3, PX4, PX5 and PX6 arranged in the same pixel row display the same grayscale, a plurality of data voltages VD1, VD2, VD3, VD4, VD5 and VD6 having different levels (e.g., voltage levels) may be applied to the plurality of data lines DA, DB, DC, DD, DE and DF by adjusting the levels of the plurality of data voltages VD1, VD2, VD3, VD4, VD5 and VD6 depending on positions of the pixels PX1, PX2, PX3, PX4, PX5 and PX6 arranged in the same pixel row based on the data stored in the look-up table 210.

For example, when the pixel PX3 is disposed closest to the connection point CP at which the main scan line SMAIN and the sub scan line SSUB are connected to each other, the data voltage VD3 having a first level V1 (e.g., a first voltage level) may be applied to the data line DC connected to the pixel PX3. When the pixel PX4 is disposed to be spaced apart from the connection point CP by a first distance d1, the data voltage VD4 having a second level V1+a different from the first level V1 may be applied to the data line DD connected to the pixel PX4.

Similarly, when the pixel PX5 is disposed to be spaced apart from the connection point CP by a second distance d2 longer than the first distance d1, the data voltage VD5 having a third level V1+b different from the first level V1 and the second level V1+a may be applied to the data line DE connected to the pixel PX5. When the pixel PX6 is disposed to be spaced apart from the connection point CP by a third distance d3 longer than the second distance d2, the data voltage VD6 having a fourth level V1+k different from the first level V1, the second level V1+a and the third level V1+b may be applied to the data line DF connected to the pixel PX6.

In some example embodiments, the second level V1+a may be higher than the first level V1, the third level V1+b may be higher than the second level V1+a, and the fourth level V1+k may be higher than the third level V1+b (e.g., a<b< . . . <k). In other words, the level of the data voltage applied to the pixel may increase as the distance from the connection point CP to the pixel increases. However, example embodiments are not limited thereto, and the operation of changing the level of the data voltage depending on the distance from the connection point CP may be implemented in various schemes.

In some example embodiments, the levels of the data voltages applied to pixels having the same distance from the connection point CP may be substantially equal to each other. For example, when the pixel PX2 is disposed to be spaced apart from the connection point CP by the first distance d1, the data voltage VD2 having the second level V1+a may be applied to the data line DB connected to the pixel PX2. The pixel PX2 may be spaced apart from the connection point CP by the first distance d1 to the left, and the pixel PX4 may be apart spaced from the connection point CP by the first distance d1 to the right. Thus, both of the pixels PX2 and PX4 may be spaced apart from the connection point CP by the same distance (e.g., the first distance d1), and both of the levels of the data voltages VD2 and VD4 applied to the pixels PX2 and PX4 may be equal to each other (e.g., the same as the second level V1+a).

Similarly, when the pixel PX1 is disposed to be spaced apart from the connection point CP by the second distance d2, the data voltage VD1 having the third level V1+b may be applied to the data line DA connected to the pixel PX1. The pixel PX1 may be spaced from the connection point CP by the second distance d2 to the left, and the pixel PX5 may be spaced from the connection point CP by the second distance d2 to the right. Thus, both of the pixels PX1 and PX5 may be spaced apart from the connection point CP by the same distance (e.g., the second distance d2), and both of the levels of the data voltages VD1 and VD5 applied to the pixels PX1 and PX5 may be equal to each other (e.g., the same as the third level V1+b).

Although FIGS. 4 and 5 illustrates only the operation of one pixel row connected to one scan line Sj, all of the plurality of pixel rows and the plurality of pixels PX connected to the plurality of scan lines S1, S2, S3, S4, . . . , SN/2, . . . , SN may operate similarly to that described with reference to FIGS. 4 and 5. In other words, when the pixels arranged in the same pixel row display the same grayscale, the plurality of data voltages having the different levels may be output and applied to a plurality of channels, respectively, and the plurality of data voltages may have the levels symmetrical with respect to the connection point CP.

To implement the above-described operation, the display apparatus 10 according to example embodiments may include the look-up table 210 that stores the operating characteristics of all of the plurality of pixels PX.

Figure 6:
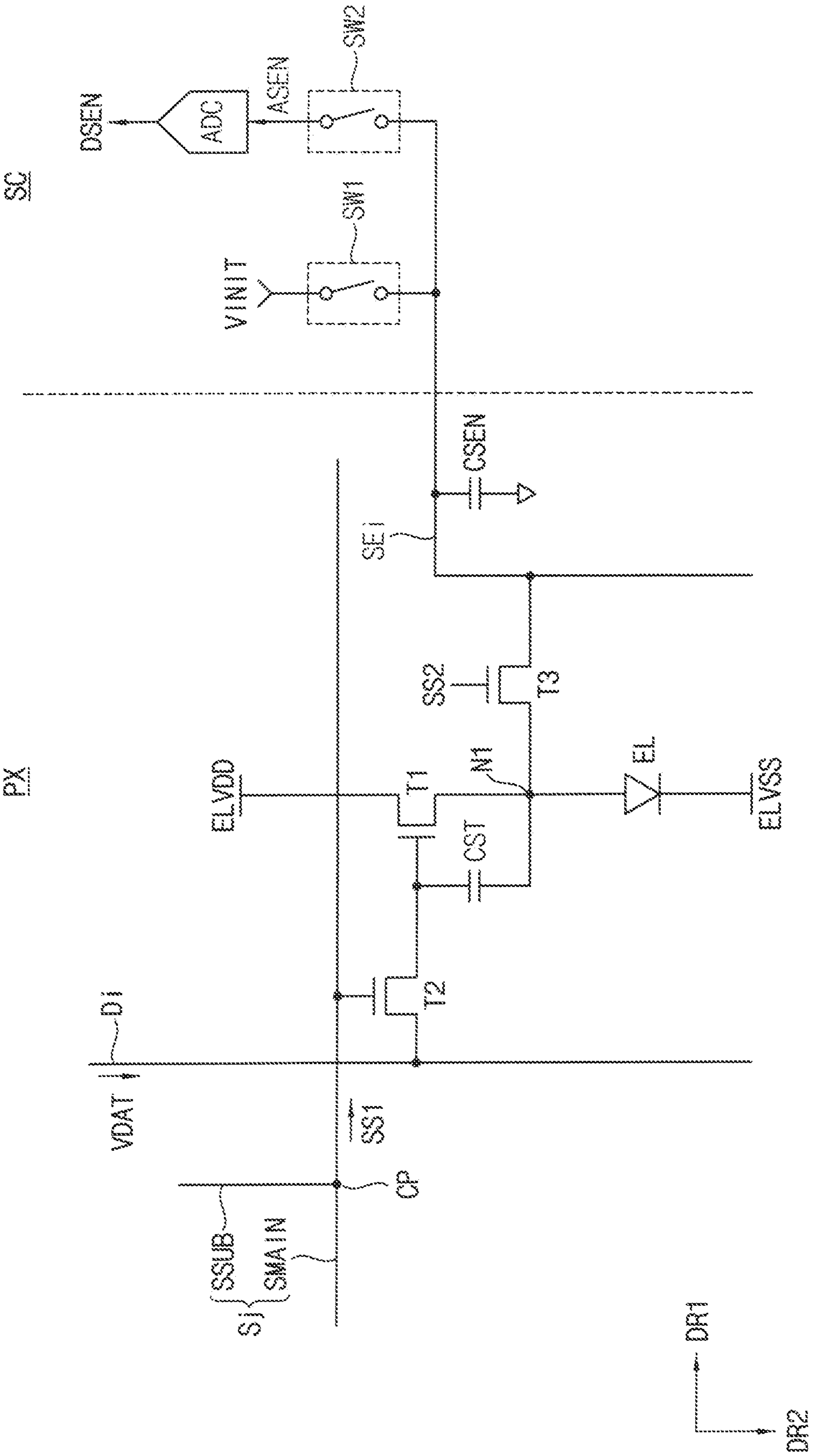
FIG. 6 is a circuit diagram illustrating an example of a sensing circuit included in a data driver of a display apparatus according to example embodiments.

FIG. 6 is a circuit diagram illustrating an example of a sensing circuit included in a data driver of a display apparatus according to example embodiments. FIG. 6 illustrates one sensing circuit SC connected to one pixel PX.

Referring to FIG. 6, the sensing circuit SC may include a first switch SW1, a second switch SW2 and an analog-to-digital converter ADC. The sensing circuit SC may have a structure for sensing a threshold voltage of the first transistor T1 included in the pixel PX.

The first switch SW1 may selectively provide the initialization voltage VINIT to the sensing line SEi, and the second switch SW2 may obtain the sensing value ASEN from the sensing line SEi. The initialization voltage VINIT may have a fixed level, and the sensing value ASEN may be an analog value associated with or related to the threshold voltage of the first transistor T1. In other words, the first switch SW1 may control the applying timing of the initialization voltage VINIT, and the second switch SW2 may control the sensing timing of the threshold voltage of the first transistor T1. For example, each of the first and second switches SW1 and SW2 may include at least one transistor, and may be turned on/off under a control of the data driver 400.

The analog-to-digital converter ADC may convert the sensing value ASEN into sensing data DSEN (e.g., digital data) for the pixel PX. The sensing data DSEN may be one sensing data corresponding to one pixel PX among the plurality of sensing data SDAT.

In some example embodiments, the sensing circuit SC may detect the sensing data DSEN once and may extract the operating characteristic of the pixel PX, e.g., the threshold voltage of the first transistor T1, using the detected sensing data DSEN. In other example embodiments, the sensing circuit SC may detect the sensing data DSEN multiple times, may average the detected sensing data DSEN, and may extract the operating characteristic of the pixel PX, e.g., the threshold voltage of the first transistor T1, using the averaged sensing data DSEN. As described above, when the averaged value of data repeatedly sensed several times in consideration of the signal-to-noise ratio (SNR) is used, more accurate data may be obtained.

Although not illustrated in FIG. 6, the sensing circuit SC may further include at least one additional switch for controlling the sensing timing and/or an amplifier. In some example embodiments, the sensing circuit SC may further include a voltage generator that generates the initialization voltage VINIT, or the initialization voltage VINIT may be provided from an external voltage generator (e.g., the power supply circuit 500 in FIG. 1).

Figure 7:
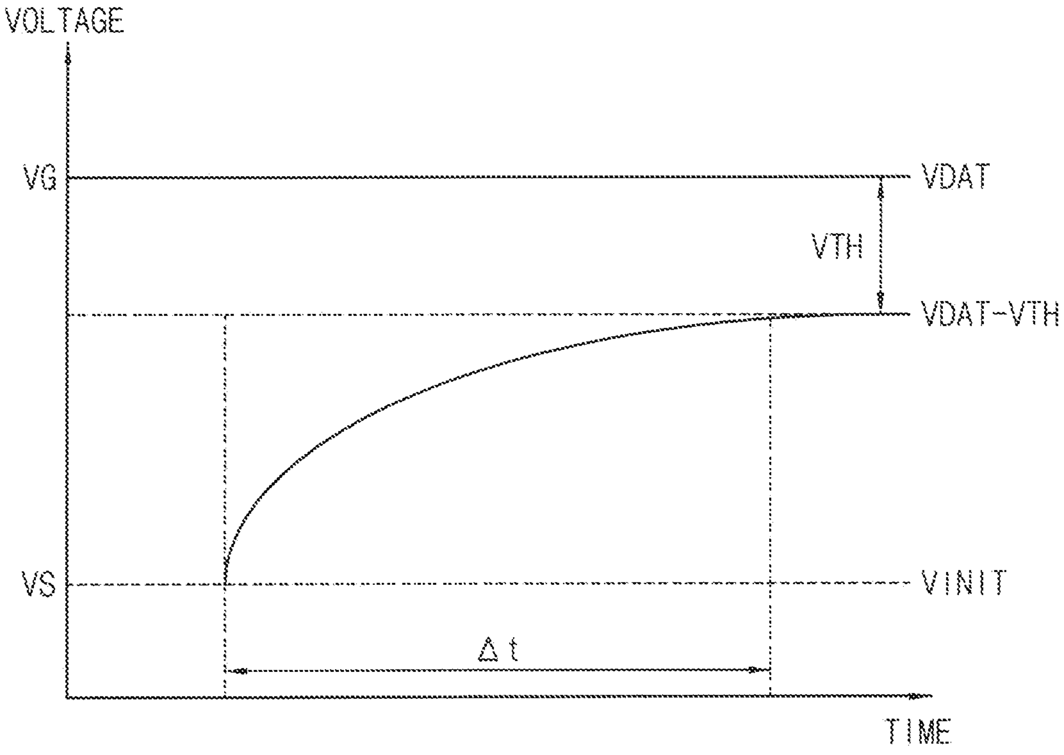
FIG. 7 is a diagram for describing an operation of sensing an operation characteristic of a pixel to obtain a look-up table in a display apparatus according to example embodiments.

FIG. 7 is a diagram for describing an operation of sensing an operation characteristic of a pixel to obtain the data stored in a look-up table in a display apparatus according to example embodiments.

Referring to FIGS. 6 and 7, an operation of sensing the operating characteristic of the pixel PX (e.g., the threshold voltage of the first transistor T1) using the sensing circuit SC to obtain the data stored in look-up table 210 is illustrated. The data stored in the look-up table 210 may be obtained in the first operation mode (e.g., in the sensing mode). In FIG. 7, VG represents a voltage or voltage level of the gate electrode of the first transistor T1, and VS represents a voltage or voltage level of the second electrode (e.g., the source electrode) of the first transistor T1.

The data driver 400 may provide the data voltage VDAT to the data line D1. The data voltage VDAT may be transmitted to the gate electrode of the first transistor T1 and the storage capacitor CST through the second transistor T2.

When the first switch SW1 is turned-on, the sensing circuit SC may provide the initializing voltage VINIT to the sensing line SEi. The initialization voltage VINIT may be transmitted to the second electrode (e.g., the source electrode) of the first transistor T1 through the third transistor T3, and may be transmitted to the sensing capacitor CSEN.

When the second switch SW2 is turned-on, the analog-to-digital converter ADC may obtain the sensing value ASEN, may convert the sensing value ASEN in the analog form into the sensing data DSEN in the digital form, and may output the sensing data DSEN.

As the above-described operations are performed in the sensing mode, the data voltage VDAT may be applied to the gate electrode of the first transistor T1, and the initialization voltage VINIT may be applied to the second electrode of the first transistor T1. For example, a level of the data voltage VDAT may be higher than a level of the initialization voltage VINIT.

A threshold voltage VTH of the first transistor T1 may be sensed or detected by sensing that the first transistor T1 is turned off, that is, by sensing that the second electrode of the first transistor T1 is charged and stabilized at a voltage level VDAT-VTH which is a voltage difference between a voltage of the gate electrode (e.g., the data voltage VDAT) and the threshold voltage VTH of the first transistor T1.

In some example embodiments, as illustrated in FIG. 7, a time Δt required for charging and stabilizing the second electrode of the first transistor T1 may be relatively long, and thus a time interval during which the scan signal SS1 and the signal SS2 are activated in the first operation mode (e.g., in the sensing mode) may be longer than one horizontal period that represents a time interval during which the scan signal SS1 is activated in the second operation mode (e.g., in the display mode).

Although an example of sensing the threshold voltage of the first transistor T1 using the sensing circuit SC is described with reference to FIGS. 6 and 7, example embodiments are not limited thereto. For example, the threshold voltage of the first transistor T1 may be sensed by sensing a current flowing through the first transistor T1 and/or using an amplifier. Alternatively, the characteristic of the first transistor T1 may be sensed using optical imaging and/or a simulation tool.

Figure 8:
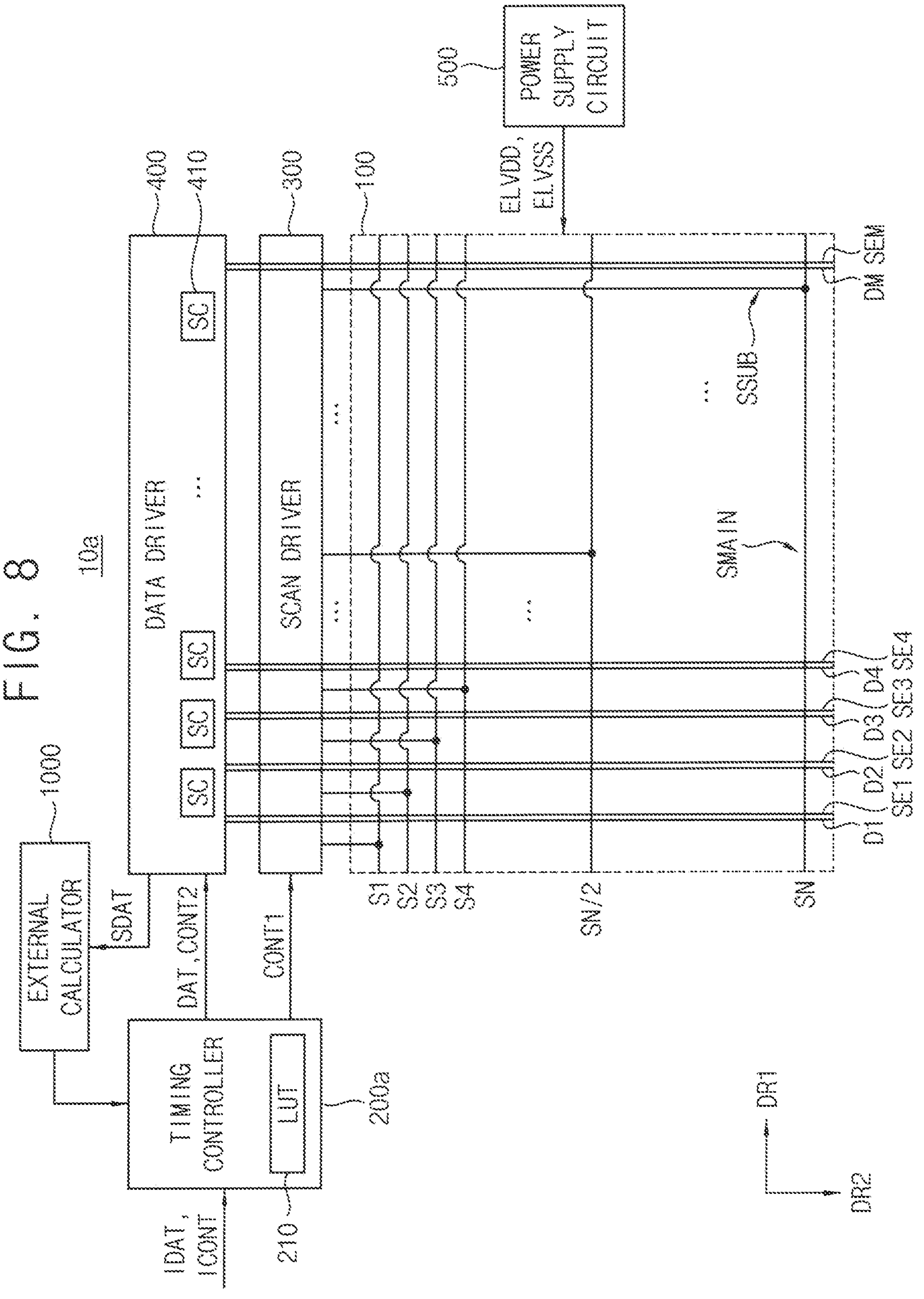
FIG. 8 is a block diagram illustrating a display apparatus according to example embodiments.
Figure 9:
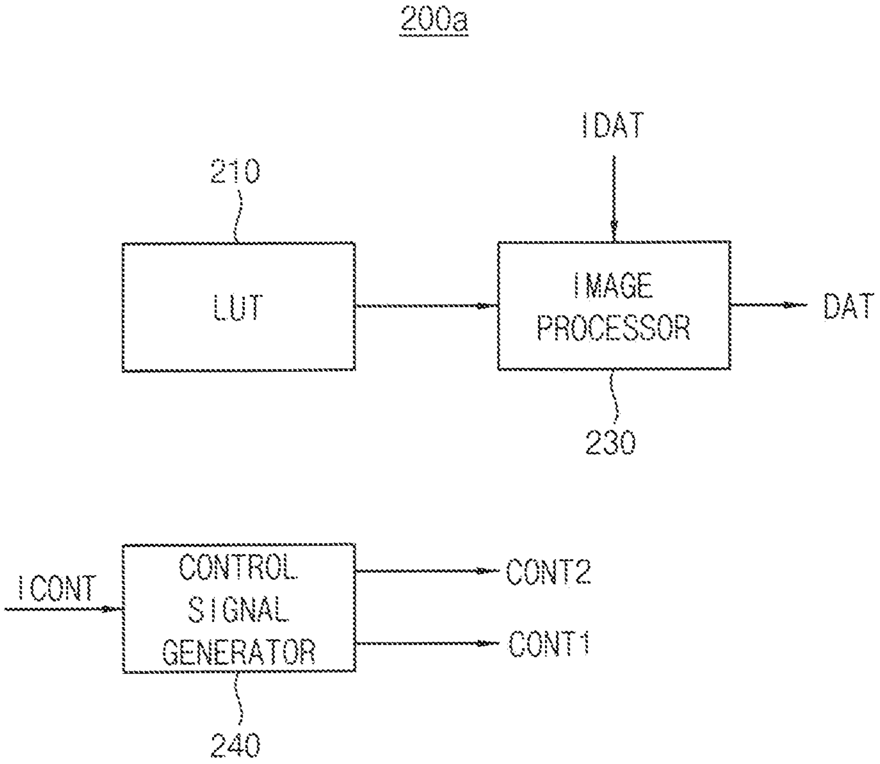
FIG. 9 is a block diagram illustrating an example of a timing controller included in a display apparatus according to example embodiments.

FIG. 8 is a block diagram illustrating a display apparatus according to example embodiments. FIG. 9 is a block diagram illustrating an example of a timing controller included in a display apparatus according to example embodiments. The descriptions repeated with FIGS. 1 and 3 will be omitted.

Referring to FIG. 8, a display apparatus 10*a* includes a display panel 100, a timing controller 200*a*, a scan driver 300 and a data driver 400. The display apparatus 10*a* may further include a power supply circuit 500.

The display apparatus 10*a* of FIG. 8 may be substantially the same as the display apparatus 10 of FIG. 1, except that the data stored in the look-up table 210 is obtained by an external calculator 1000 and a configuration of the timing controller 200*a* is partially changed.

In an example of FIG. 8, the plurality of sensing data SDAT may not be directly provided to the timing controller 200*a*, and may be directly provided to the external calculator 1000 disposed outside of the timing controller 200*a*. The external calculator 1000 may extract the operating characteristics of all of the plurality of pixels PX based on the plurality of sensing data SDAT, and may obtain the data which will be stored in the look-up table 210. The timing controller 200*a* may receive the data which will be stored in the look-up table 210 obtained by the external calculator 1000 from the external calculator 1000, and may store the data in the look-up table 210. The external calculator 1000 may have a configuration similar to the calculator 220 included in the timing controller 200 of FIG. 3.

Referring to FIG. 9, the timing controller 200*a* may include the look-up table 210 and an image processor 230. The timing controller 200*a* may further include a control signal generator 240.

The timing controller 200*a* of FIG. 9 may be substantially the same as the timing controller 200 of FIG. 3, except that the calculator 220 is omitted in the timing controller 200*a*.

Figure 10:
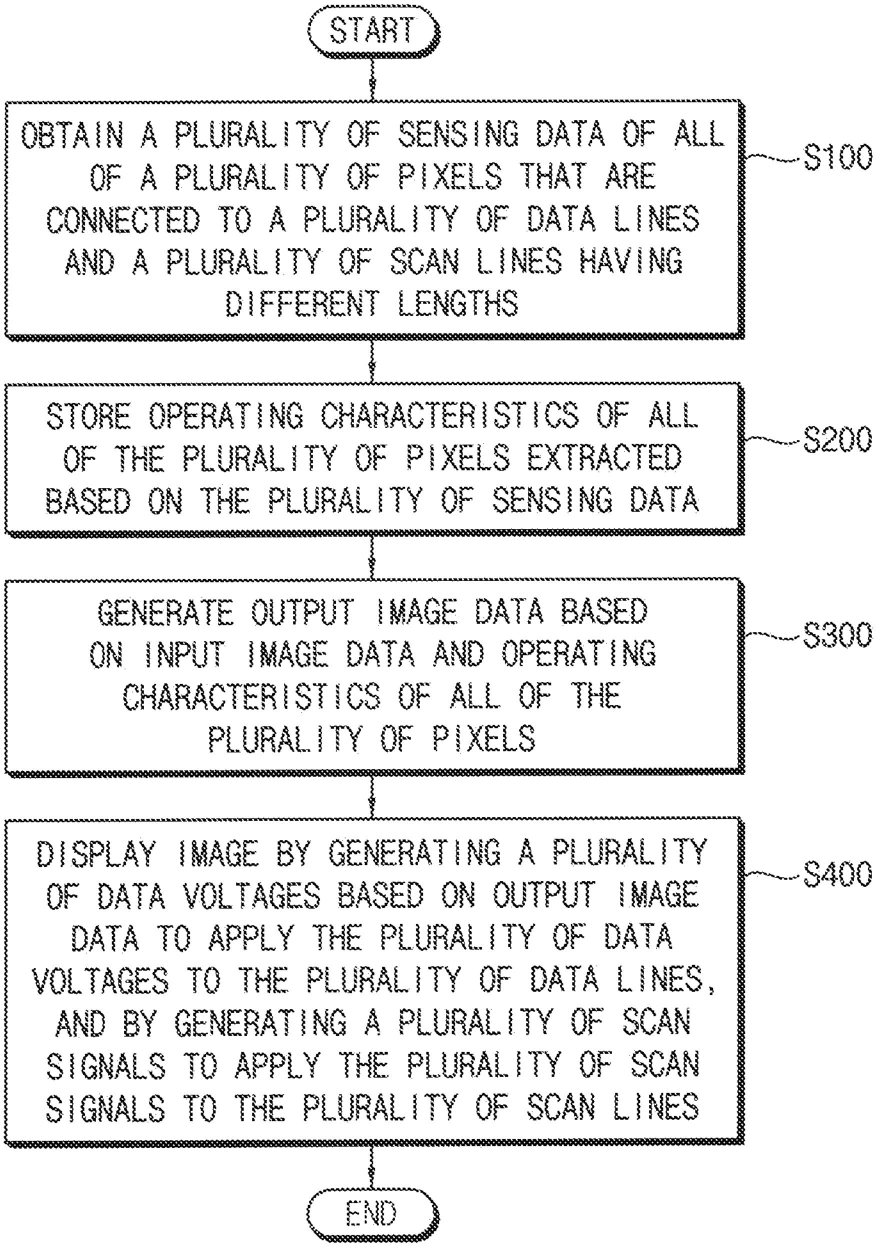
FIG. 10 is a flowchart illustrating a method of operating a display apparatus according to example embodiments.

FIG. 10 is a flowchart illustrating a method of operating a display apparatus according to example embodiments.

Referring to FIG. 10, a method of operating a display apparatus according to example embodiments may be performed by a display apparatus that is implemented with a single-side driving scheme and includes a plurality of scan lines having different lengths. A detailed configuration of the display apparatus may be substantially the same as that described with reference to FIGS. 1 through 9.

In the method of operating the display apparatus according to example embodiments, a plurality of sensing data that represent operating characteristics of all of a plurality of pixels included in a display panel are obtained (step S100). The plurality of pixels are connected to a plurality of data lines and the plurality of scan lines having different lengths. The operating characteristics of all of the plurality of pixels extracted based on the plurality of sensing data are stored (step S200). Output image data is generated based on input image data and the operating characteristics of all of the plurality of pixels (step S300). An image is displayed on the display panel by generating a plurality of data voltages based on the output image data to apply the plurality of data voltages to the plurality of data lines, and by generating a plurality of scan signals to apply the plurality of scan signals to the plurality of scan lines (step S400).

In some example embodiments, in steps S100 and S200, the operating characteristics of all of the plurality of pixels may be obtained and stored as a look-up table. The operation of obtaining/storing data in the look-up table in steps S100 and S200 may be performed in the first operation mode (e.g., the sensing mode), and the operation of generating the output image data in steps S300 and S400 may be performed in the second operation mode (e.g., the display mode). For example, step S100 may be performed by the plurality of sensing circuits 410 included in the data driver 400, steps S200 and S300 may be performed by the timing controller 200, and step S400 may be performed by the scan driver 300 and the data driver 400.

In some example embodiments, as described with reference to FIGS. 6 and 7, the operation of obtaining the plurality of sensing data in step S100 may be performed by applying an initialization voltage to a plurality of sensing lines formed separately from the plurality of data lines and connected to the plurality of pixels, by obtaining a plurality of sensing values through the plurality of sensing lines, and by converting the plurality of sensing values into digital data.

In some example embodiments, as described with reference to FIGS. 4 and 5, when pixels arranged in the same pixel row among the plurality of pixels display the same grayscale, the operation of displaying the image on the display panel in step S400 may be performed by adjusting levels of the plurality of data voltages depending on positions of the pixels arranged in the same pixel row, and by applying the plurality of data voltages having different levels to the plurality of data lines.

Figure 11:
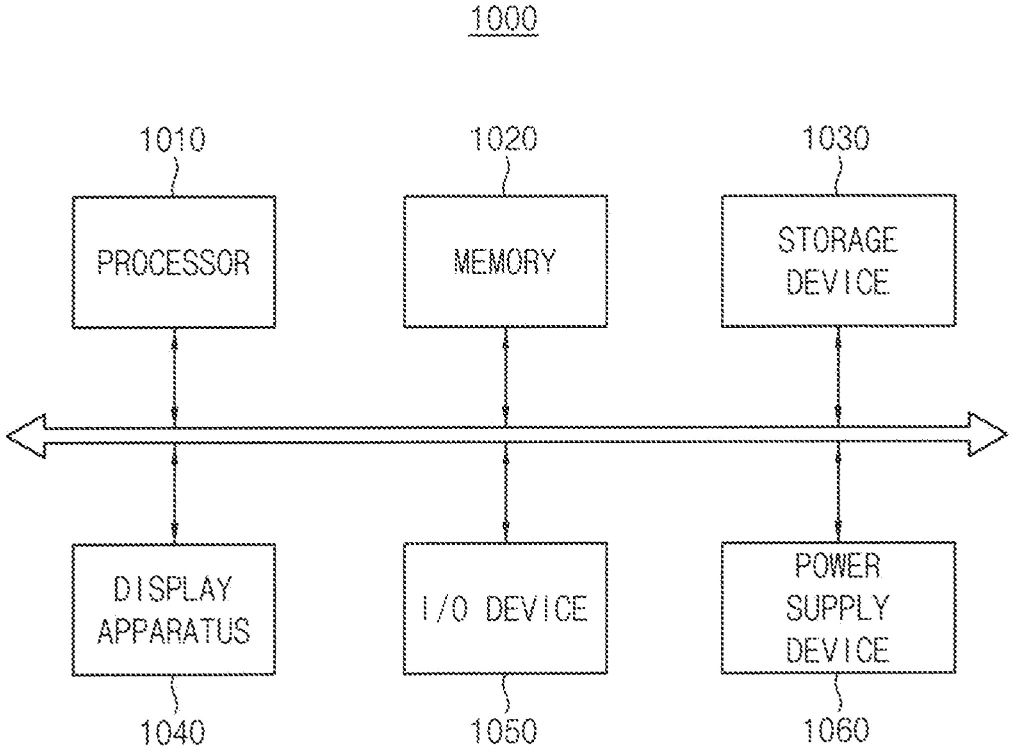
FIG. 11 is a block diagram illustrating an electronic system including a display apparatus according to example embodiments.

FIG. 11 is a block diagram illustrating an electronic system including a display apparatus according to example embodiments.

Referring to FIG. 11, an electronic system 1000 includes a processor 1010, a memory 1020, a storage device 1030, a display apparatus 1040, an input/output (I/O) device 1050 and a power supply device 1060.

The processor 1010 may perform various computational functions such as particular calculations and tasks. For example, the processor 1010 may be a central processing unit (CPU), a microprocessor, an application processor (AP), etc.

The memory 1020 and the storage device 1030 may store data required for operating the electronic system 1000 and/or data processed by the processor 1010. For example, the memory 1020 may include a volatile memory such as a dynamic random access memory (DRAM), a static random access memory (SRAM), etc., and/or a nonvolatile memory such as an electrically erasable programmable read-only memory (EEPROM), a flash memory, a phase change random access memory (PRAM), a resistance random access memory (RRAM), a magnetic random access memory (MRAM), a ferroelectric random access memory (FRAM), a nano floating gate memory (NFGM), or a polymer random access memory (PoRAM), etc. The storage device 1030 may include a CD-ROM, a hard disk drive (HDD), a solid state drive (SSD), etc.

The I/O device 1050 may include at least one input device such as a keypad, a button, a microphone, a touch screen, etc., and/or at least one output device such as a speaker, a printer, etc. The power supply device 1060 may provide power to the electronic system 1000.

The display apparatus 1040 may be the display apparatus according to example embodiments. For example, as described with reference to FIGS. 1 through 10, the display apparatus 1040 may perform the data compensating operation to compensate for the coupling phenomenon caused by the plurality of sub scan lines SSUB based on the look-up table 210. Accordingly, the display apparatus 1040 may have relatively improved display quality.

The present disclosure may be applied to various devices and/or systems including the display apparatuses. For example, the present disclosure may be applied to systems such as a personal computer (PC), a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display apparatus comprising:

a display panel including a plurality of pixels that are connected to a plurality of data lines and a plurality of scan lines having different lengths;

a scan driver applying a plurality of scan signals to the plurality of scan lines;

a data driver applying a plurality of data voltages to the plurality of data lines and receive a plurality of sensing data that represent operating characteristics of all of the plurality of pixels from a plurality of sensing lines; and a timing controller controlling operations of the scan driver and the data driver, generate output image data considering the operating characteristics of all of the plurality of pixels and supply the output image data to the data driver, wherein a first main scan line among a plurality of main scan lines and a first sub scan line among a plurality of sub scan lines form a first scan line among the plurality of scan lines, wherein pixels arranged in a first pixel row among the plurality of pixels are connected to the first scan line, and wherein, when the pixels arranged in the first pixel row display a same grayscale, the plurality of data voltages having different levels are applied to the plurality of data lines by adjusting the levels of the plurality of data voltages depending on positions of the pixels arranged in the first pixel row.

2. The display apparatus of claim 1, wherein the timing controller includes:

a look-up table storing the operating characteristics of all of the plurality of pixels;

a calculator extracting the operating characteristics of all of the plurality of pixels based on the plurality of sensing data, and store the extracted operating characteristics to the look-up table; and an image processor generating the output image data based on the data stored in the look-up table and input image data.

3. The display apparatus of claim 1, wherein the timing controller includes:

a look-up table storing the operating characteristics of all of the plurality of pixels; and an image processor generating the output image data based on the data stored in the look-up table and input image data, wherein an external calculator is extracting the operating characteristics of all of the plurality of pixels based on the plurality of sensing data, and store the extracted data to the look-up table.

4. The display apparatus of claim 1, wherein the plurality of scan lines include:

the plurality of main scan lines extending in a first direction and connected to the plurality of pixels; and the plurality of sub scan lines extending in a second direction crossing the first direction and connecting the scan driver with the plurality of main scan lines.

5. The display apparatus of claim 4, wherein:

lengths of the plurality of main scan lines are equal to each other, and lengths of the plurality of sub scan lines are different from each other.

6. The display apparatus of claim 4, wherein:

the plurality of data lines extend in the second direction and are connected to the plurality of pixels, and the plurality of sub scan lines and the plurality of data lines are alternately arranged along the first direction.

7. The display apparatus of claim 6, wherein the scan driver and the data driver are arranged together on one side of the display panel.

8. The display apparatus of claim 4, wherein:

when a first pixel disposed closest to a first connection point at which the first main scan line and the first sub scan line are connected to each other, a first data voltage having a first level is applied to a first data line connected to the first pixel, and when a second pixel spaced apart from the first connection point by a first distance, a second data voltage having a second level different from the first level is applied to a second data line connected to the second pixel.

9. The display apparatus of claim 8, wherein:

when a third pixel spaced apart from the first connection point by a second distance, a third data voltage having a third level different from the first level is applied to a third data line connected to the third pixel, and when the first distance and the second distance are equal to each other, the second level and the third level are equal to each other.

10. The display apparatus of claim 8, wherein the second level is higher than the first level.

11. The display apparatus of claim 10, wherein the second level increases as the first distance increases.

12. The display apparatus of claim 1, wherein the data driver includes:

a plurality of sensing circuits connected to the plurality of pixels through the plurality of sensing lines that are insulated from the plurality of data lines and obtaining the plurality of sensing data through the plurality of sensing lines.

13. The display apparatus of claim 12, wherein a first pixel among the plurality of pixels includes:

a first transistor connected between a first power supply voltage and a first node, and including a gate electrode;

a second transistor including a first electrode connected to a first data line, a gate electrode connected to a first scan line, and a second electrode connected to the gate electrode of the first transistor;

an organic light emitting diode connected between the first node and a second power supply voltage;

a storage capacitor connected between the gate electrode of the first transistor and the first node; and a third transistor connected between the first node and a first sensing line, and including a gate electrode.

14. The display apparatus of claim 13, wherein a first sensing circuit among the plurality of sensing circuits includes:

a first switch selectively providing an initialization voltage to the first sensing line;

a second switch obtaining a first sensing value from the first sensing line; and an analog-to-digital converter converting the first sensing value into first sensing data for the first pixel.

15. The display apparatus of claim 14, wherein the operating characteristic of the first pixel is extracted by detecting the first sensing data multiple times and by averaging the detected first sensing data.

16. The display apparatus of claim 14, wherein the operating characteristic of the first pixel includes a threshold voltage of the first transistor.

17. A method of operating a display apparatus including a display panel, the method comprising:

obtaining a plurality of sensing data that represent operating characteristics of all of a plurality of pixels included in the display panel, the plurality of pixels being connected to a plurality of data lines and a plurality of scan lines having different lengths;

storing the operating characteristics of all of the plurality of pixels extracted based on the plurality of sensing data;

generating output image data based on input image data and the operating characteristics of all of the plurality of pixels; and displaying an image on the display panel by generating a plurality of data voltages based on the output image data to apply the plurality of data voltages to the plurality of data lines, and by generating a plurality of scan signals to apply the plurality of scan signals to the plurality of scan lines, wherein, when pixels arranged in a same pixel row among the plurality of pixels display a same grayscale, the image is displayed on the display panel by adjusting levels of the plurality of data voltages depending on positions of the pixels arranged in the same pixel row and by applying the plurality of data voltages having different levels to the plurality of data lines.

18. The method of claim 17, wherein the plurality of sensing data are obtained by applying an initialization voltage to a plurality of sensing lines that are formed separately from the plurality of data lines and connected to the plurality of pixels, by obtaining a plurality of sensing values through the plurality of sensing lines, and by converting the plurality of sensing values into digital data.

19. A display apparatus comprising:

a display panel including a plurality of pixels that are connected to a plurality of data lines, a plurality of sensing lines and a plurality of scan lines having different lengths, each of the plurality of pixels including an organic light emitting diode and a first transistor for driving the organic light emitting diode;

a scan driver driving the plurality of scan lines; and a data driver driving the plurality of data lines based on a plurality of sensing data that represent operating characteristics of all of the plurality of pixels, and including a plurality of sensing circuits obtaining the plurality of sensing data through the plurality of sensing lines, each of the plurality of sensing circuits comprising:

a first switch providing an initialization voltage to one of the plurality of sensing lines; and an analog-to-digital converter performing an analog-to-digital conversion on a sensing value obtained from the one of the plurality of sensing lines, wherein, when pixels arranged in a same pixel row among the plurality of pixels display a same grayscale, the image is displayed on the display panel by adjusting levels of a plurality of data voltages depending on positions of the pixels arranged in the same pixel row and by applying the plurality of data voltages having different levels to the plurality of data lines.

20. The display apparatus of claim 19, wherein:

the first transistor is connected between a first power supply voltage and a first node, and the organic light emitting diode is connected between the first node and a second power supply voltage, wherein each of the plurality of sensing circuits further includes: a second transistor connected between one of the plurality of data lines and a gate electrode of the first transistor; a storage capacitor connected between the gate electrode of the first transistor and the first node; and a third transistor connected between the first node and one of the plurality of sensing lines.

21. The display apparatus of claim 19, wherein each of the plurality of sensing circuits further includes:

a second switch connecting the analog-to-digital converter to the one of the plurality of sensing lines.

22. The display apparatus of claim 19, wherein the operating characteristics of all of the plurality of pixels extracted based on the plurality of sensing data include a threshold voltage of the first transistor.

23. The display apparatus of claim 19, further comprising:

a timing controller controlling operations of the scan driver and the data driver, and store the operating characteristics of all of the plurality of pixels in a look-up table.

24. The display apparatus of claim 19, wherein the scan driver and the data driver are arranged together on one side of the display panel.

25. The display apparatus of claim 24, wherein the lengths of plurality of scan lines become longer as a distance from the scan driver increases.

26. The display apparatus of claim 19, wherein the plurality of scan lines include:

a plurality of main scan lines extending in a first direction and connected to the plurality of pixels; and a plurality of sub scan lines extending in a second direction crossing the first direction and connecting the scan driver with the plurality of main scan lines.

27. The display apparatus of claim 26, wherein:

lengths of the plurality of main scan lines are equal to each other, and lengths of the plurality of sub scan lines are different from each other.

28. A display device comprising:

a plurality of pixels disposed in a display area through which an image is displayed, the plurality of pixels being connected to a plurality of scan lines each of which having different lengths and including a main scan line extending along a first direction and a sub scan line extending along a second direction substantially perpendicular to the first direction, a plurality of data lines extending along the second direction and a plurality of sensing lines extending along the second direction;

a scan driver connected to the plurality of scan lines; and a data driver connected to the plurality of data lines, wherein the main scan line and the sub scan line are connected to each other in the display area, and wherein the main scan line is formed of a conductive layer forming the plurality of scan lines and the sub scan line is formed of a conductive layer forming the plurality of data lines.

29. The display device of claim 28, further comprising an interlayer insulating layer disposed between the main scan line and the sub scan line, wherein the main scan line and the sub scan line are connected to each other through a contact hole formed in the interlayer insulating layer.

30. The display device of claim 28, wherein a plurality of sub scan lines of the plurality of scan lines include a first portion in which at least two of the plurality of sub scan lines are disposed adjacent to each other and a second portion in which one sub scan line is disposed between adjacent data lines.

* * * * *